US006411254B1

(12) United States Patent
Moeglein et al.

(10) Patent No.: US 6,411,254 B1
(45) Date of Patent: Jun. 25, 2002

(54) SATELLITE POSITIONING REFERENCE SYSTEM AND METHOD

(75) Inventors: Mark Moeglein, Fremont; Leonid Sheynblat, Belmont; Norman F. Krasner, San Carlos, all of CA (US)

(73) Assignee: SnapTrack, Inc., Campbell, CA (US)

( * ) Notice: Subject to any disclaimer, the term of this patent is extended or adjusted under 35 U.S.C. 154(b) by 0 days.

(21) Appl. No.: 09/835,924

(22) Filed: Apr. 10, 2001

Related U.S. Application Data (63) Continuation of application No. 09/067,407, filed on Apr. 28, 1998, now Pat. No. 6,215,441, which is a continuation-in-part of application No. 08/842,559, filed on Apr. 15, 1997, now Pat. No. 6,208,290.

(51) Int. Cl.⁷ ............................. G01S 5/02; H04B 7/185
(52) U.S. Cl. ............................. 342/357.01; 342/357.09; 342/357.1; 701/215
(58) Field of Search ................. 342/357.01, 357.03, 342/357.1, 357.09; 701/215

(56) References Cited

U.S. PATENT DOCUMENTS 5,155,490 A * 10/1992 Spradley, Jr. et al.
5,323,322 A * 6/1994 Mueller et al.
5,477,458 A * 12/1995 Loomis
5,621,646 A * 4/1997 Enge et al.

FOREIGN PATENT DOCUMENTS

WO    WO 97/14054    * 4/1997

OTHER PUBLICATIONS

JPL SCIGN Analysis (from http://milhouse.jpl.nasa.gov.) Jun. 7, 1996.*

* cited by examiner

*Primary Examiner*—Theodore M. Blum
(74) *Attorney, Agent, or Firm*—Blakely, Sokoloff, Taylor & Zafman, LLP (57) ABSTRACT

Methods and apparatuses which use satellite position system (SPS) reference receivers. In one example of the invention, a plurality of SPS reference receivers, such as Global Positioning System (GPS) reference receivers, each having a known position, are dispersed over a geographical region. Each of the SPS reference receivers transmits into a communication network, a representation of at least a portion of a satellite navigation message, such as satellite ephemeris data, received from SPS satellites in view of the particular SPS reference receiver. A plurality of digital processing systems, such as a first and a second digital processing systems, are coupled to the communication network to receive the satellite ephemeris data which is transmitted through the communication network.

5 Claims, 9 Drawing Sheets

SATELLITE POSITIONING REFERENCE SYSTEM AND METHOD

RELATED APPLICATIONS

This application is a continuation of U.S. patent application Ser. No. 09/067,407, filed Apr. 28, 1998, now U.S. Pat. No. 6,215,441.

BACKGROUND OF THE INVENTION

The present invention relates to satellite position systems which use reference receivers and more particularly to a network of reference receivers for a satellite positioning system.

Conventional satellite positioning systems (SPS) such as the U.S. Global Positioning System (GPS) use signals from satellites to determine their position. Conventional GPS receivers normally determine their position by computing relative times of arrival of signals transmitted simultaneously from a multiplicity of GPS satellites which orbit the earth. Each satellite transmits, as part of its navigation message, both satellite positioning data as well as data on clock timing which specifies its position and clock state at certain times; this data, found in subframes 1–3 of the GPS navigation message, is often referred to as satellite clock and ephemeris data and will be referred to as satellite ephemeris data. Conventional GPS receivers typically search for and acquire GPS signals, read the navigation message from each signal to obtain satellite ephemeris data for its respective satellite, determine pseudoranges to these satellites, and compute the location of the GPS receiver from the pseudoranges and satellite ephemeris data from the satellites.

Improved position accuracy can be obtained by using a well known and conventional technique referred to as differential GPS. With conventional differential GPS, a single differential reference station broadcasts differential GPS corrections to users in a local region. Thus, there are typically three major components of a conventional differential GPS system. The first component is a reference station at a known location with a GPS receiver at a known location which is usually capable of observing all satellites in view and optionally with software at the reference station, which could be imbedded in the GPS receiver, to compute the pseudorange corrections and to code them for specific broadcast format Another component is a radio link to transmit the differential corrections in real time to mobile GPS receivers. The third component is the mobile GPS receiver which also includes a receiver for receiving the differential corrections broadcast from the reference station.

The differential GPS corrections are used by the mobile GPS receivers in a conventional manner to correct the pseudorange data which is obtained by computing the relative times of arrival of signals of GPS signals transmitted from the GPS satellites. Conventional differential GPS does not have to operate in real time or provide corrections to the mobile GPS receiver, although this is often the case. There are many improvements on differential GPS which are described in both patent and non patent literature. These various improvements concentrate on the differential correction computation and application algorithms as well as methods of delivering the differential corrections. The differential corrections are for the most part in the measurement domain (pseudorange, accumulated delta-range, and range-rate error estimates).

Conventional differential GPS offers significant position accuracy improvement if both the reference receiver and the participating mobile GPS receiver are in close proximity to each other. However, the accuracy improvement from differential GPS degrades as the separation distance between the two receivers increases. One solution to rectify this degrading of accuracy is to provide a network of GPS reference receivers which are dispersed over a geographical area to provide area coverage which coincides with the area in which the mobile GPS receivers may operate such that they tend to see the same set of satellites. In this instance, a mobile GPS receiver may pick up differential corrections from more than one differential reference station, and the mobile GPS receiver may select those differential corrections for satellites in view based upon the relative proximity between the mobile GPS receiver and the two or more reference stations. The use of multiple reference stations in a differential GPS system is sometimes referred to as widearea differential GPS (WADGPS).

A further form of a WADGPS reference system includes a network of GPS reference receivers and a master station which is in communication with the reference stations to receive their measurements and compute a merged set of ephemeris and clock correction estimates for each GPS satellite observed by the reference stations. This master station can then provide through a transmitter a differential GPS message with corrections applicable over an extended range. Examples of such wide-area differential GPS reference systems include those described in U.S. Pat. Nos. 5,323,322 and 5,621,646.

Independent of the coverage of the particular differential reference system, the prime objective of a differential GPS system is to provide differential service which helps the mobile GPS receiver to remove errors from the GPS measurements or measurement derived solution. The GPS system errors that the network attempts to remove is a function of the number of reference stations, their spatial placement, and the sophistication of the algorithms implemented at the central processing facility. The secondary function of the differential networks is to provide integrity and reliability to the differential service by performing various checks in the measurement and the state space domains.

While the foregoing systems provide improved accuracy to mobile GPS receivers, those systems are not compatible with a client/server GPS architecture in which a mobile GPS receiver functions as a client system and provides pseudorange measurements to a remotely positioned location server which completes the calculations for the position solution by using the pseudoranges obtained from the mobile GPS receiver and by using ephemeris data. The present invention provides an improved method and apparatus allowing flexibility in the positioning of location servers and also provides for improved efficiency and cost in a client/server system.

SUMMARY OF THE INVENTION

The present invention provides methods and apparatuses for a satellite positioning system reference system.

In one aspect of the present invention, an exemplary method processes satellite position information by using at least two SPS reference receivers. According to this method, a first digital processing system receives a first satellite ephemeris data from a first SPS reference receiver which has a first known position. The first digital processing system also receives a second satellite ephemeris data from a second SPS reference receiver having a second known position. The first digital processing system further receives a plurality of pseudorange data from a mobile SPS receiver. The first digital processing system then typically calculates the position information (e.g. latitude and longitude and altitude) of the mobile SPS receiver using the plurality of pseudorange data and at least one of the first satellite ephemeris data and the second satellite ephemeris data. In one particular embodiment of the present invention, the first satellite ephemeris data and the second satellite ephemeris data are a subset of the "raw" 50 bps satellite navigation message received respectively from the first SPS reference receiver and the second SPS reference receiver from the satellites in view of those two reference receivers. In one example, this satellite navigation message may be the 50 bit per second data message encoded into the GPS signals which has been received and decoded by the reference receivers and transmitted to the first digital processing system in real time or near real time.

According to another aspect of the present invention, a system for processing satellite position information includes a plurality of satellite positioning system (SPS) reference receivers, each having a known location. It also includes a plurality of digital processing systems. The plurality of SPS reference receivers is dispersed over a geographical region and each receives satellite ephemeris data from satellites in view of the respective SPS reference receiver. Each of the plurality of SPS receivers transmits, into a communication network, the satellite ephemeris data which it receives. This system also includes a plurality of digital processing systems, each of which is coupled to the communication network to receive at least some of the satellite ephemeris data transmitted through the communication network. In one embodiment, at least two such digital processing systems exist. A first digital processing system receives a first plurality of pseudorange from a first mobile SPS receiver and calculates a first position information (e.g. a latitude and a longitude) of the first mobile SPS receiver from the first plurality of pseudorange data and from satellite ephemeris data received from the communication network. Typically, the first digital processing system selectively receives from the network the proper satellite ephemeris data for at least those satellites which are in view of the first mobile SPS receiver. A second digital processing system receives a second plurality of pseudorange data from a second mobile SPS receiver and calculates a second position information of the second mobile SPS receiver from the second plurality of pseudorange data and from satellite ephemeris data received from the communication network. In one example of the invention, the second digital processing system selectively receives from the network the appropriate satellite ephemeris for those satellites in view of the second mobile SPS receiver. In another example of the invention, the first and second digital processing systems each receive from the network the most up-to-date satellite ephemeris data which are in view of the network.

In one further embodiment of the present invention, a further digital processing system may be coupled to the communication network in order to receive measurements (e.g. differential corrections) from the reference receivers and to produce a set of network differential corrections. Various other aspects and embodiments of the present invention are further described below.

BRIEF DESCRIPTION OF THE DRAWINGS

The present invention is illustrated by way of example and not limitation in the figures of the accompanying drawings in which like references indicate similar elements.

DETAILED DESCRIPTION

The present invention provides a network of SPS reference receivers which provide at least a portion of the satellite navigation message, such as satellite ephemeris data for use by digital processing systems in the manner described below. Before describing various details with respect to this reference system, it will be useful to describe the context in which this reference receiver is typically used. Accordingly, a preliminary discussion which refers to FIGS. 1, 2, and 3A will be provided before discussing the network of SPS reference receivers in the system of the present invention.

Figure 1:
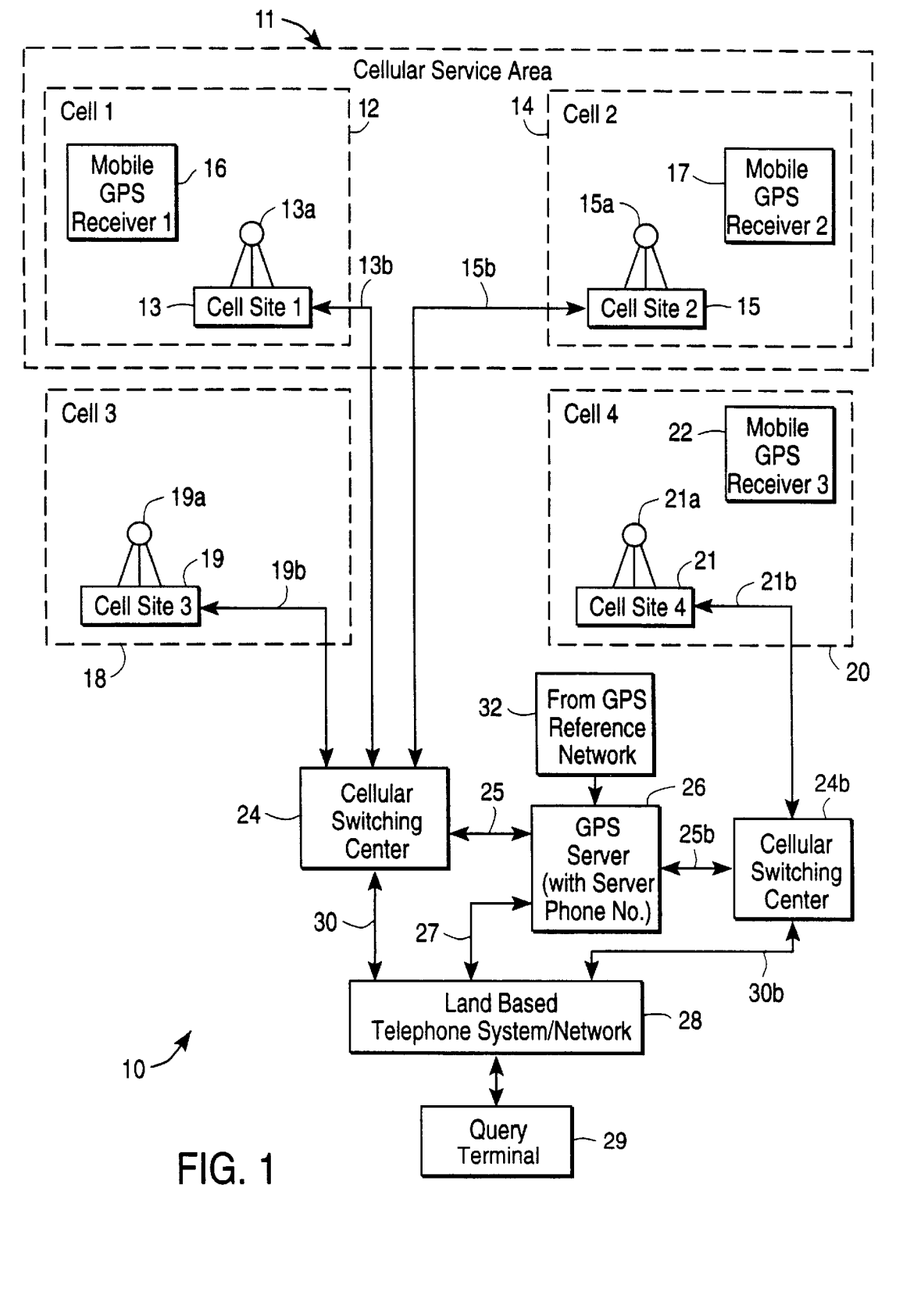
FIG. 1 illustrates a cell based communication system having a plurality of cells each of which is serviced by a cell site, and each of which is coupled to a cell based switching center, which is sometimes referred to as a mobile switching center.

FIG. 1 shows an example of a cell based communication system 10 which includes a plurality of cell sites, each of which is designed to service a particular geographical region or location. Examples of such cellular based or cell based communication systems are well known in the art, such as the cell based telephone systems. The cell based communication system 10 includes two cells 12 and 14, both of which are defined to be within a cellular service area 11. In addition, the system 10 includes cells 18 and 20. It will be appreciated that a plurality of other cells with corresponding cell sites and/or cellular service areas may also be included in the system 10 coupled to one or more cellular switching centers, such as the cellular switching center 24 and the cellular switching center 24b.

Figure 3A:
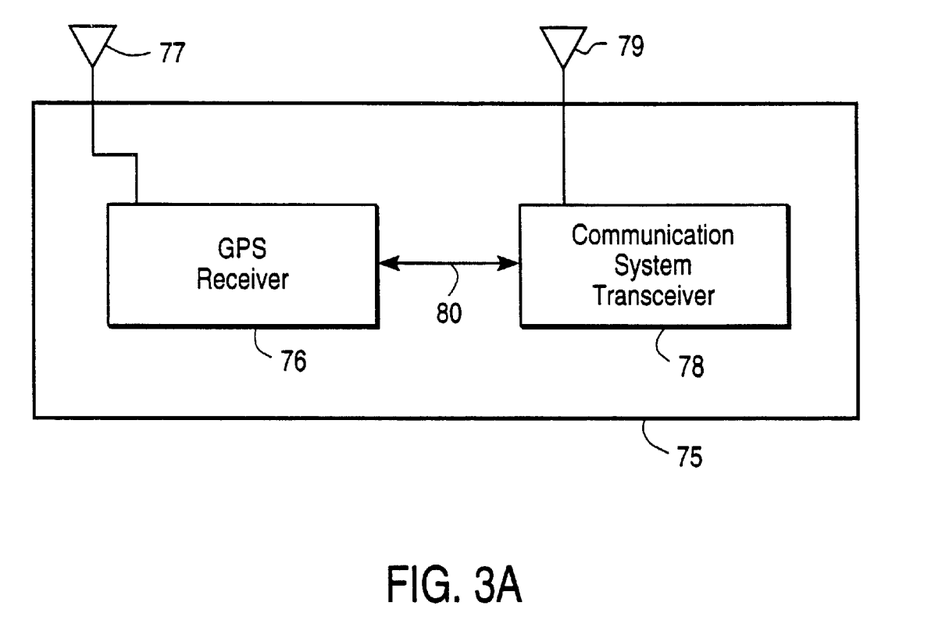
FIG. 3A illustrates an example of a combined SPS receiver and communication system according to one embodiment of the present invention.

Within each cell, such as the cell 12, there is a wireless cell or cellular site such as cell site 13 which includes an antenna 13a which is designed to communicate through a wireless communication medium with a communication receiver which may be combined with a mobile GPS receiver such as the receiver 16 shown in FIG. 1. An example of such a combined system having a GPS receiver and a communication system is shown in FIG. 3A and may include both a GPS antenna 77 and a communication system antenna 79.

Each cell site is coupled to a cellular switching center. In FIG. 1, cell sites 13, 15, and 19 are coupled to switching center 24 through connections 13b, 15b and 19b respectively and cell site 21 is coupled to a different switching center 24b through connection 21b. These connections are typically wire line connections between the respective cell site and the cellular switching centers 24 and 24b. Each cell site includes an antenna for communicating with communication systems serviced by the cell site. In one example, the cell site may be a cellular telephone cell site which communicates with mobile cellular telephones in the area serviced by the cell site. It will be appreciated that a communication system within one cell, such as receiver 22 shown in cell 4, may in fact communicate with cell site 19 in cell 18 due to blockage (or other reasons why cell site 21 cannot communicate with the receiver 22).

In a typical embodiment of the present invention, the mobile GPS receiver 16 includes a cell based communication system which is integrated with the GPS receiver such that both the GPS receiver and the communication system are enclosed in the same housing. One example of this is a cellular telephone having an integrated GPS receiver which shares common circuitry with the cellular telephone transceiver. When this combined system is used for cellular telephone communications, transmissions occur between the receiver 16 and the cell site 13. Transmissions from the receiver 16 to the cell site 13 are then propagated over the connection 13b to the cellular switching center 24 and then to either another cellular telephone in a cell serviced by the cellular switching center 24 or through a connection 30 (typically wired) to another telephone through the land-based telephone system/network 28. It will be appreciated that the term wired includes fiber optic and other non wireless connections such as copper cabling, etc. Transmissions from the other telephone which is communicating with the receiver 16 are conveyed from the cellular switching center 24 through the connection 13b and the cell site 13 back to the receiver 16 in the conventional manner.

The remote data processing system 26 (which may be referred to in some embodiments as a GPS server or a location server) is included in the system 10 and is used to determine the state (e.g. the position and/or velocity and/or time) of a mobile GPS receiver (e.g. receiver 16) using GPS signals received by the GPS receiver. The GPS server 26 may be coupled to the land-based telephone system/network 28 through a connection 27, and it may also be optionally coupled to the cellular switching center 24 through the connection 25 and also optionally coupled to center 24b through the connection 25b. It will be appreciated that connections 25 and 27 are typically wired connections, although they may be wireless. Also shown as an optional component of the system 10 is a query terminal 29 which may consist of another computer system which is coupled through the network 28 to the GPS server 26. This query terminal 29 may send a request, for the position and/or velocity of a particular GPS receiver in one of the cells, to the GPS server 26 which then initiates a conversation with a particular GPS receiver through the cellular switching center in order to determine the position and/or velocity of the GPS receiver and report requested information back to the query terminal 29. In another embodiment, a position determination for a GPS receiver may be initiated by a user of a mobile GPS receiver; for example, the user of the mobile GPS receiver may press 911 on the cell phone to indicate an emergency situation at the location of the mobile GPS receiver and this may initiate a location process in the manner described herein.

It should be noted that a cellular based or cell based communication system is a communication system which has more than one transmitter, each of which serves a different geographical area, which is predefined at any instant in time. Typically, each transmitter is a wireless transmitter which serves a cell which has a geographical radius of less than 20 miles, although the area covered depends on the particular cellular system. There are numerous types of cellular communication systems, such as cellular telephones, PCS (personal communication system), SMR (specialized mobile radio), one-way and two-way pager systems, RAM, ARDIS, and wireless packet data systems. Typically, the predefined geographical areas are referred to as cells and a plurality of cells are grouped together into a cellular service area, such as the cellular service area 11 shown in FIG. 1, and these pluralities of cells are coupled to one or more cellular switching centers which provide connections to land-based telephone systems and/or networks. Service area are often used for billing purposes. Hence, it may be the case that cells in more than one service area are connected to one switching center. For example, in FIG. 1, cells 1 and 2 are in service area 11 and cell 3 is in service area 13, but all three are connected to switching center 24. Alternatively, it is sometimes the case that cells within one service area are connected to different switching centers, especially in dense population areas. In general, a service area is defined as a collection of cells within close geographical proximity to one another. Another class of cellular systems that fits the above description is satellite based, where the cellular basestations or cell sites are satellites that typically orbit the earth. In these systems, the cell sectors and service areas move as a function of time. Examples of such systems include Iridium, Globalstar, Orbcomm, and Odyssey.

Figure 2:
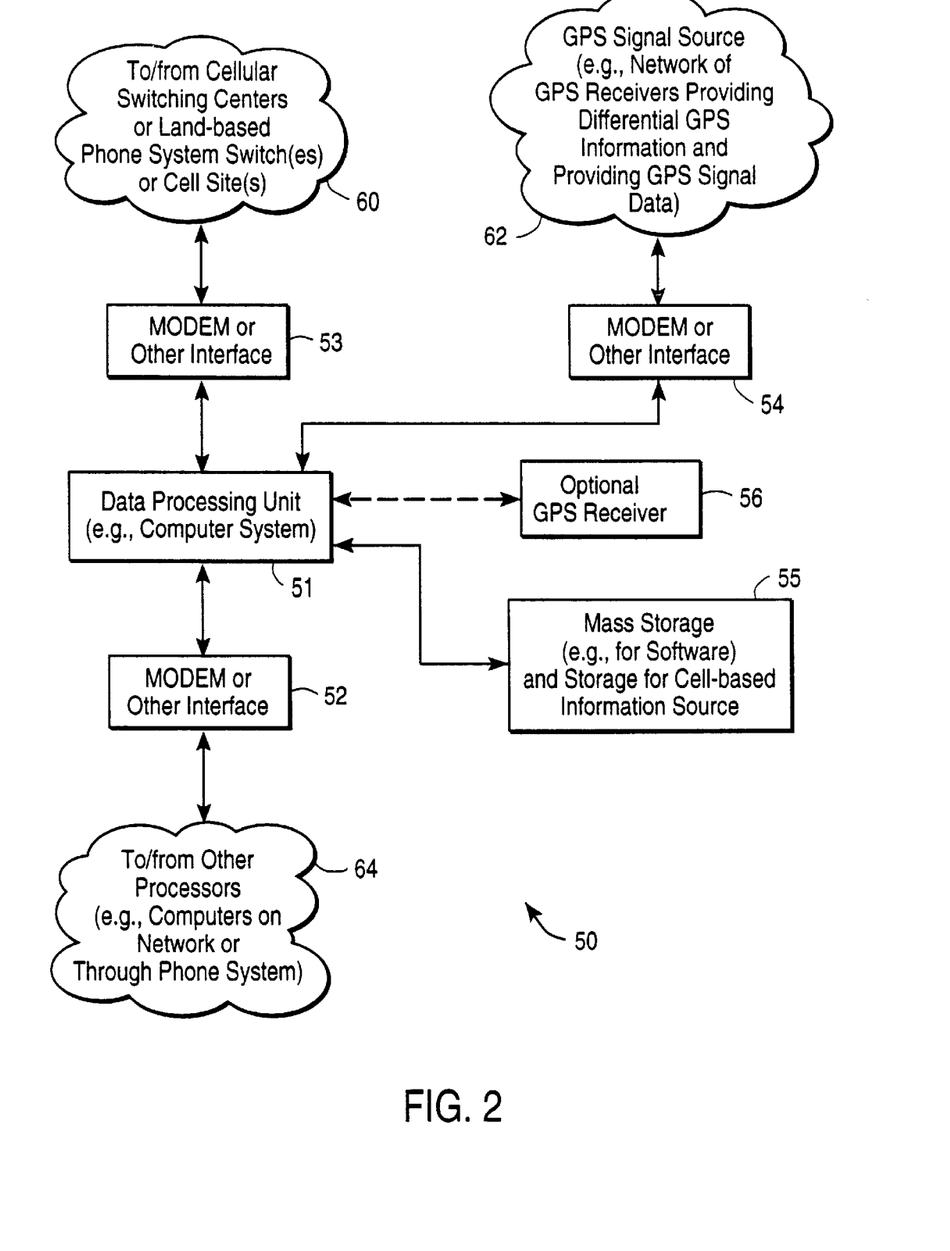
FIG. 2 illustrates an implementation of a location server system according to one embodiment of the invention.

FIG. 2 shows an example of a GPS server 50 which may be used as the GPS server 26 in FIG. 1. The GPS server 50 of FIG. 2 includes a data processing unit 51 which may be a fault-tolerant digital computer system. The SPS server 50 also includes a modem or other communication interface 52 and a modem or other communication interface 53 and a modem or other communication interface 54. These communication interfaces provide connectivity for the exchange of information to and from the location server shown in FIG. 2 between three different networks, which are shown as networks 60, 62, and 64. The network 60 includes the cellular switching center or centers and/or the land-based phone system switches or the cell sites. An example of this network is shown in FIG. 1 wherein the GPS server 26 represents the server 50 of FIG. 6. Thus the network 60 may be considered to include the cellular switching centers 24 and 24b and the land-based telephone system/network 28 and the cellular service area 11 as well as cells 18 and 20. The network 64 may be considered to include the query terminal 29 of FIG. 1 or the "PSAP," which is the Public Safety Answering Point which is typically the control center which answers 911 emergency telephone calls. In the case of the query terminal 29, this terminal may be used to query the server 26 in order to obtain a state (e.g. position) information from a designated mobile SPS receiver located in the various cells of the cell based communication system. In this instance, the location operation is initiated by someone other than the user of the mobile GPS receiver. In the case of a 911 telephone call from the mobile GPS receiver which includes a cellular telephone, the location process is initiated by the user of the cellular telephone. The network 62, which represents the GPS reference network 32 of FIG. 1, is a network of GPS receivers which are GPS reference receivers designed to provide differential GPS correction information and also to provide GPS signal data including at least a portion of the satellite navigation message such as the satellite ephemeris data to the data processing unit. When the server 50 serves a very large geographical area, a local optional GPS receiver, such as optional GPS receiver 56, may not be able to observe all GPS satellites that are in view of mobile SPS receivers throughout this area. Accordingly, the network 62 collects and provides at least a portion of the satellite navigation message such as satellite ephemeris data and differential GPS correction data over a wide area in accordance with one embodiment of the present invention.

Figure 6:
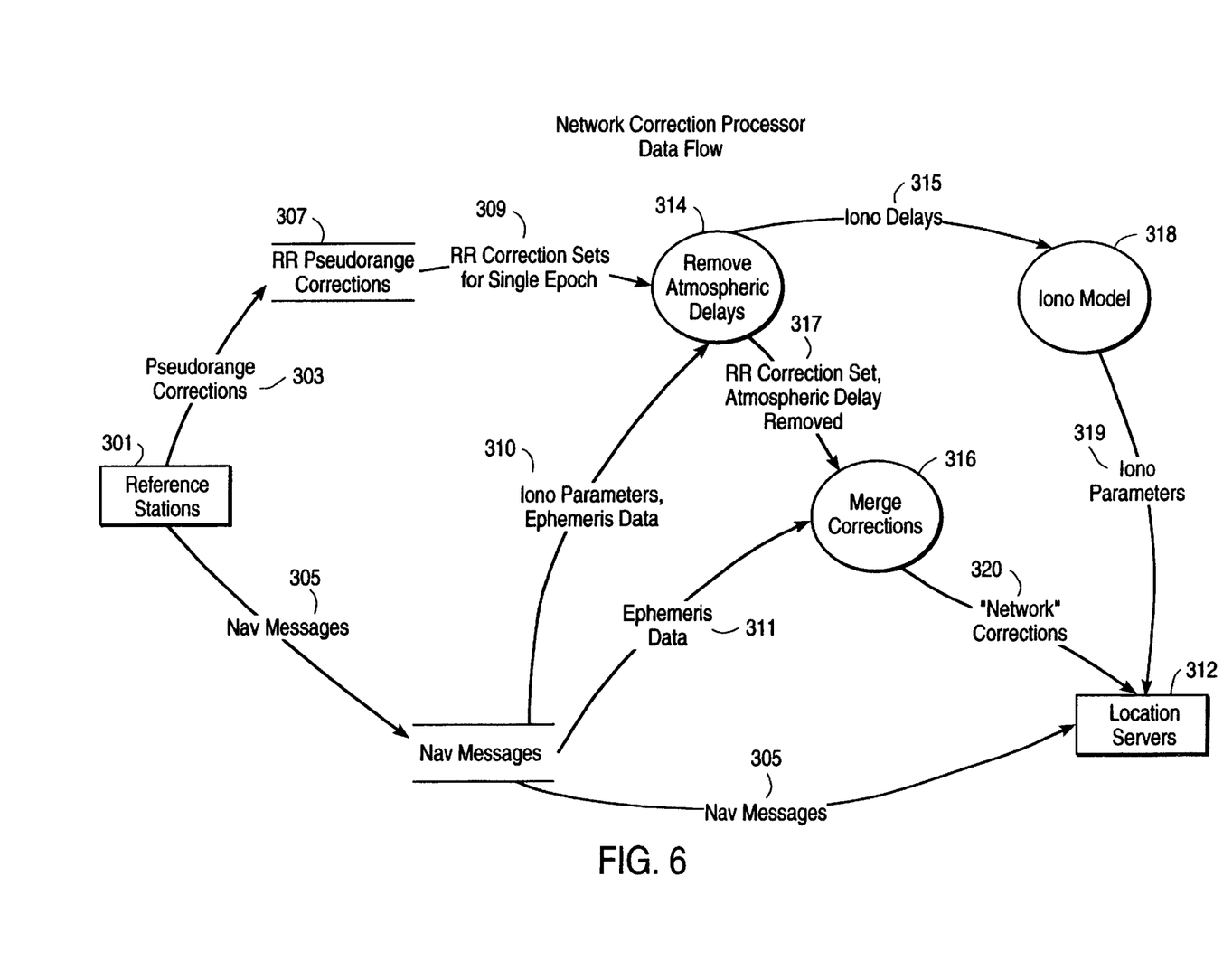
FIG. 6 shows a data flow for a network correction processor which may be used in one embodiment of the reference receiver network according to the present invention.

As shown in FIG. 6, a mass storage device 55 is coupled to the data processing unit 51. Typically, the mass storage 55 will include storage for software and data for performing the GPS position calculations after receiving pseudoranges from the mobile GPS receivers, such as a receiver 16 of FIG. 1. These pseudoranges are normally received through the cell site and cellular switching center and the modem or other interface 53. The mass storage device 55 also includes software, at least in one embodiment, which is used to receive and use the satellite ephemeris data provided by the GPS reference network 32 through the modem or other interface 54.

In a typical embodiment of the present invention, the optional GPS receiver 56 is not necessary as the GPS reference network 32 of FIG. 1 (shown as network 62 of FIG. 2) provides the differential GPS information as well as providing the raw satellite navigation message from the satellites in view of the various reference receivers in the GPS reference network. It will be appreciated that the satellite ephemeris data obtained from the network through the modem or other interface 54 may be used in a conventional manner with the pseudoranges obtained from the mobile GPS receiver in order to compute the position information for the mobile GPS receiver. The interfaces 52, 53, and 54 may each be a modem or other suitable communication interface for coupling the data processing unit to other computer systems, as in the case of network 64, and to cellular based communication systems, as in the case of network 60, and to transmitting devices, such as computer systems in the network 62. In one embodiment, it will be appreciated that the network 62 includes a dispersed collection of GPS reference receivers dispersed over a geographical region.

FIG. 3A shows a generalized combined system which includes a GPS receiver and a communication system transceiver. In one example, the communication system transceiver is a cellular telephone. The system 75 includes a GPS receiver 76 having a GPS antenna 77 and a communication transceiver 78 having a communication antenna 79. The GPS receiver 76 is coupled to the communication transceiver 78 through the connection 80 shown in FIG. 3A. In one mode of operation, the communication system transceiver 78 receives approximate Doppler information through the antenna 79 and provides this approximate Doppler information over the link 80 to the GPS receiver 76 which performs the pseudorange determination by receiving the GPS signals from the GPS satellites through the GPS antenna 77. This pseudorange is then transmitted to a location server, such as the GPS server shown in FIG. 1 through the communication system transceiver 78. Typically the communication system transceiver 78 sends a signal through the antenna 79 to a cell site which then transfers this information back to the GPS server, such as GPS server 26 of FIG. 1. Examples of various embodiments for the system 75 are known in the art. For example, U.S. Pat. No. 5,663,734 describes an example of a combined GPS receiver and communication system which utilizes an improved GPS receiver system. Another example of a combined GPS and communication system has been described in co-pending application Ser. No. 08/652,833, which was filed May 23, 1996. The system 75 of FIG. 3A, as well as numerous alternative communication systems having SPS receivers, may be employed with the methods of the present invention to operate with the GPS reference network of the present invention.

Figure 3B:
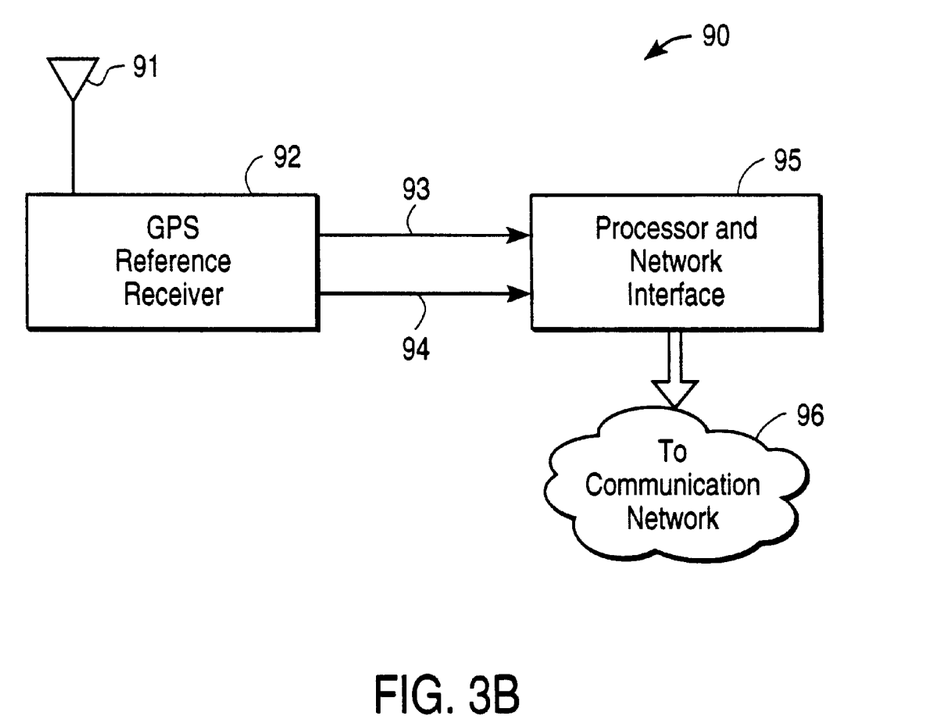
FIG. 3B illustrates an example of a GPS reference station according to one embodiment of the present invention.

FIG. 3B shows one embodiment for a GPS reference station. It will be appreciated that each reference station may be constructed in this way and coupled to the communication network or medium. Typically, each GPS reference station, such as GPS reference station 90 of FIG. 3B, will include a single or dual frequency GPS reference receiver 92 which is coupled to a GPS antenna 91 which receives GPS signals from GPS satellites in view of the antenna 91. GPS reference receivers are well known in the art. The GPS reference receiver 92, according to one embodiment of the present invention, provides at least two types of information as outputs from the receiver 92. Pseudorange outputs 93 are provided to a processor and network interface 95, and these pseudorange outputs are used to compute pseudorange corrections in the conventional manner for those satellites in view of the GPS antenna 91. The processor and network interface 95 may be a conventional digital computer system which has interfaces for receiving data from a GPS reference receiver as is well known in the art. The processor 95 will typically include software designed to process the pseudorange data to determine the appropriate pseudorange correction for each satellite in view of the GPS antenna 91. These pseudorange corrections (and/or the pseudorange data outputs) are then transmitted through the network interface to the communication network or medium 96 to which other GPS reference stations are also coupled. The GPS reference receiver 92 also provides in one embodiment a representation of at least a portion of the satellite navigation message such as a satellite ephemeris data output 94. This data is provided to the processor and network interface 95 which then transmits this data onto the communication network 96.

In one embodiment, the entire satellite navigation message is transmitted into the network from each reference receiver at a higher than normal rate. Certain conventional GPS receivers can output raw (digital) navigation message data once every 6 seconds (which may be considered a normal rate); e.g. certain NovAtel GPS receivers have this capability. These receivers collect in a buffer the digital data of one subframe of the navigation message (300 bits in the case of a standard GPS signal), and then provide this data at the output of the receiver by shifting out the data in the buffer (after buffering a full subframe of 300 bits) once every 6 seconds. However, in one embodiment of the invention, at least a portion of a representation of the digital navigation message is transmitted into the network at a rate of once every 600 milliseconds. This high data rate makes it possible to perform a method for measuring time as described in co-pending U.S. patent application Ser. No. 08/794,649, filed Feb. 3, 1997. In this embodiment of the invention, a portion of the navigation message is transmitted into the network once every 600 milliseconds by collecting in a buffer only a portion of a subframe (e.g. 30 bits) and shifting out this portion once the portion is collected. Thus, the packets of data which are transmitted from the processor 95 into the network have a smaller portion of the navigation message than what could be provided at in packets created from a buffer of one fall subframe (of 300 bits). It will be appreciated that once the buffer has collected the portion of the subframe (e.g. 30 bits), the data may be shifted out into packets which are transmitted at very high data rates (e.g. 512K bps) over the network of the present invention. These packets (containing fewer than a full subframe) are then reassembled at a receiving digital processing system by extracting and concatenating data from several packets to recreate the full subframe.

In one embodiment of the invention, each GPS reference station transmits a representation of at least a portion of the satellite navigation message and the pseudorange data (rather than the pseudorange correction data). The pseudorange correction data can be derived from pseudorange and ephemeris information for a particular satellite. Thus, a GPS reference station may transmit into the network either pseudorange correction data or ephemeris (or both). However, in a preferred embodiment, pseudorange data (instead of pseudorange correction data) is transmitted from each GPS reference station into the network because corrections from different receivers may be derived from different sets of ephemeris data, causing discrepancies in the corrections from different receivers. With this preferred embodiment, a central correction processor (such as network correction processor 110 shown in FIG. 4) uses a consistent set of the most recent ephemeris data received from any of the GPS reference receivers, thus avoiding these discrepancies. The set is consistent because it consists of a group of ephemeris, range measurements (e.g. pseudoranges) and/or corrections from a plurality of satellites which is applicable at one particular instant in time. A set may be merged with other sets of data as long as the times of applicability of each set overlap.

Referring back to FIG. 3B, the satellite ephemeris data output 94 provides typically at least part of the entire raw 50 baud navigation binary data encoded in the actual GPS signals received from each GPS satellite. The satellite ephemeris data is part of the navigation message which is broadcast as the 50 bit per second data stream in the GPS signals from the GPS satellites and is described in great detail in the GPS ICD-200 document. The processor and network interface 95 receives this satellite ephemeris data output 94 and transmits it in real time or near real time to the communication network 96. As will be described below, this satellite ephemeris data which is transmitted into the communication network is later received through the network at various location servers according to aspects of the present invention.

In certain embodiments of the present invention, only certain segments of the satellite navigation message may be sent to location servers in order to lower the bandwidth requirements for the network interfaces and for the communication network. Also, this data may not need to be provided continuously. For example, only the first three subframes which contain ephemeris information rather than all 5 subframes together may be transmitted into the communication network 96 when they contain updated information. It will be appreciated that in one embodiment of the present invention, the location server may use the navigation message data transmitted from one or more GPS reference receivers in order to perform a method for measuring time related to satellite data messages, such as the method described in co-pending U.S. patent application Ser. No. 08/794,649, which was filed Feb. 3, 1997, by Norman F. Krasner. It will be also understood that the GPS reference receiver 92 decoded the different GPS signals from the different GPS satellites in view of the reference receiver 92 in order to provide the binary data output 94 which contains the satellite ephemeris data.

Typically, the packets of data are not addressed to specific location servers and include portions of the navigation message and include an identifier of which data was received from which satellite; in some embodiments, the packets may also specify an identifier of the transmitting reference station. In some embodiments, the optional GPS receiver 56 may be the primary source of navigation message data which is used by the local location server and the network of the present invention may provide information on demand.

Figure 4:
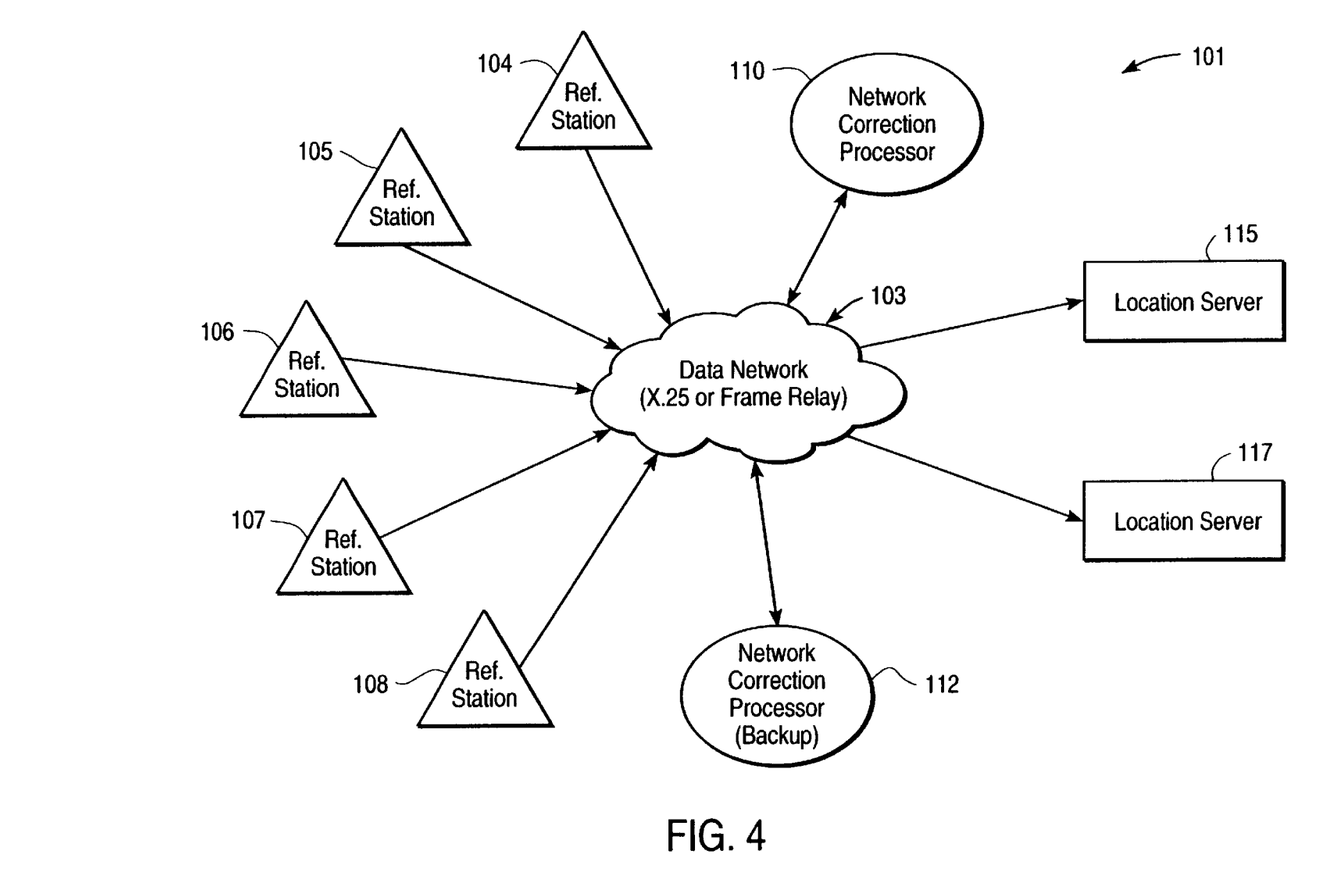
FIG. 4 illustrates an SPS reference receiver network according to one embodiment of the present invention.

FIG. 4 shows an example of a GPS reference receiver network. In the example of FIG. 4, the entire system 101 includes two location servers 115 and 117 which are coupled to a communication network or medium 103 which corresponds to the communication network 96 of FIG. 3B. Network correction processors 110 and 112 are also coupled to the communication network 103. Five GPS reference stations 104, 105, 106, 107, and 108 are shown in FIG. 4. Each of these reference stations is coupled to the communication network 103. Each GPS reference station, such as GPS reference station 104, corresponds to the exemplary GPS reference station 90 shown in FIG. 3B, and the communication network 103 corresponds to the communication network 96 shown in FIG. 3B. It will be appreciated that the GPS reference stations, such as reference stations 104–108 are dispersed over a geographical region in order to provide receiver coverage for GPS signals which may also be received by mobile GPS receivers. Typically this coverage between adjacent reference stations overlaps such that a complete geographical area is completely covered. The geographical region for the entire network of reference stations may span the entire world or any subset thereof such as a city, a state, a nation, or a continent. Each GPS reference station, such as GPS reference station 104, provides pseudorange correction data to the communication network 103 and also provides the raw navigation data message which is used by the location servers as described herein, such as location server 115. As described below, the location servers may be fewer in number than the reference stations and thus will be processing pseudorange data from widely separated mobile GPS receivers. For example, one location server may be processing pseudorange data from a mobile GPS receiver in California and a reference station in California, and the same location server may be processing pseudorange data for a mobile GPS receiver in New York and a reference station in New York. Thus a single location server may be receiving navigation messages from two or more reference stations which may be widely dispersed. As shown in FIG. 4, the communication network may be a data network such as a frame relay or ATM network or other high speed digital communication network.

FIG. 4 also shows two network correction processors 110 and 112; these processors provide merged network corrections for multiple reference stations in one embodiment and may also provide ionospheric data to the location servers. The operation in one embodiment of a network correction processor is described further below. Typically, these processors determine the proper pseudorange corrections from pseudoranges and ephemeris having the same applicable time and merge the appropriate sets of corrections and ephemeris data into one set having the same or overlapping applicable time. The merged set is then retransmitted on the network for receipt by the location servers which are coupled to the network.

Figure 5A:
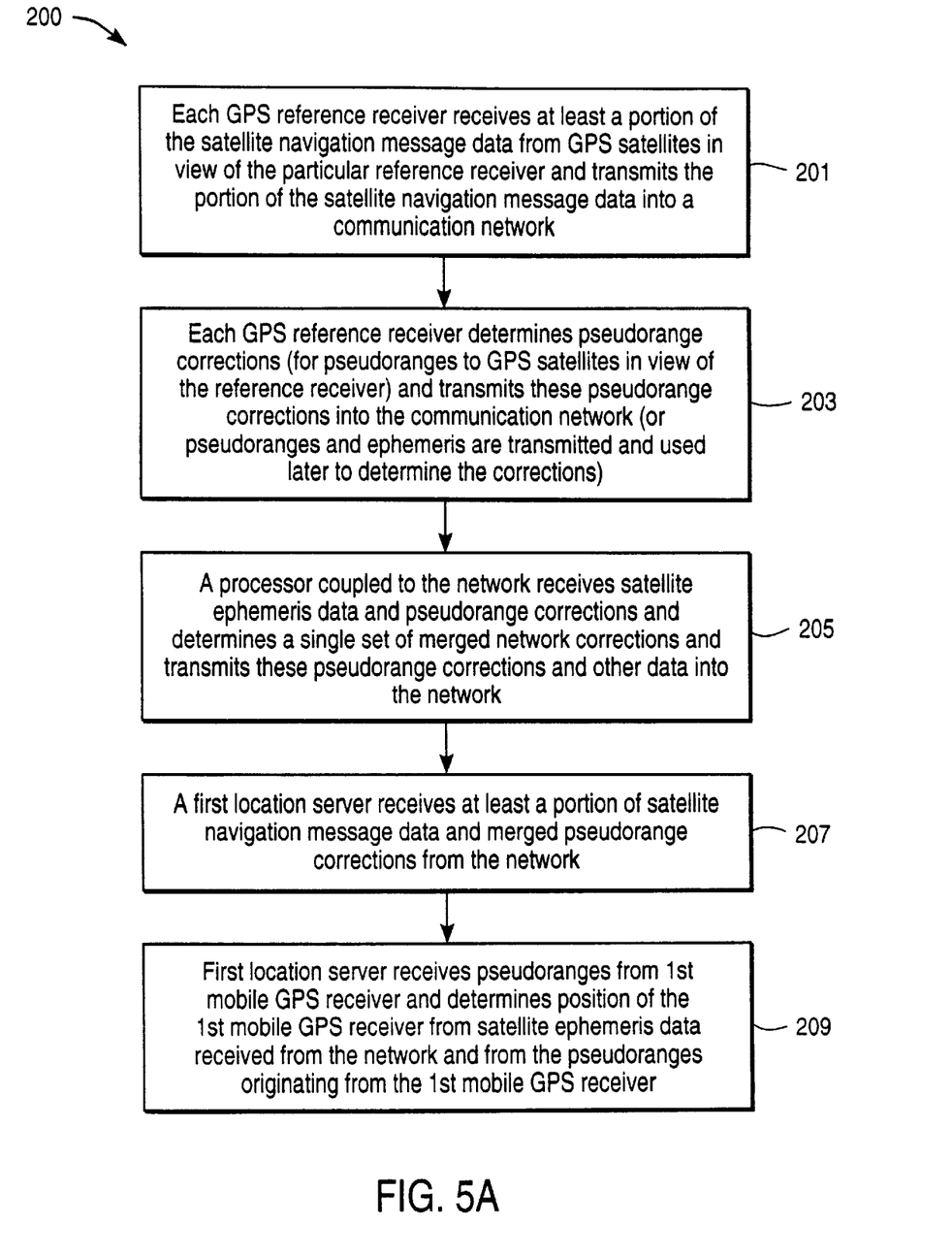
FIGS. 5A and 5B show a flowchart which describes a method according to one embodiment of the present invention.
Figure 5B:
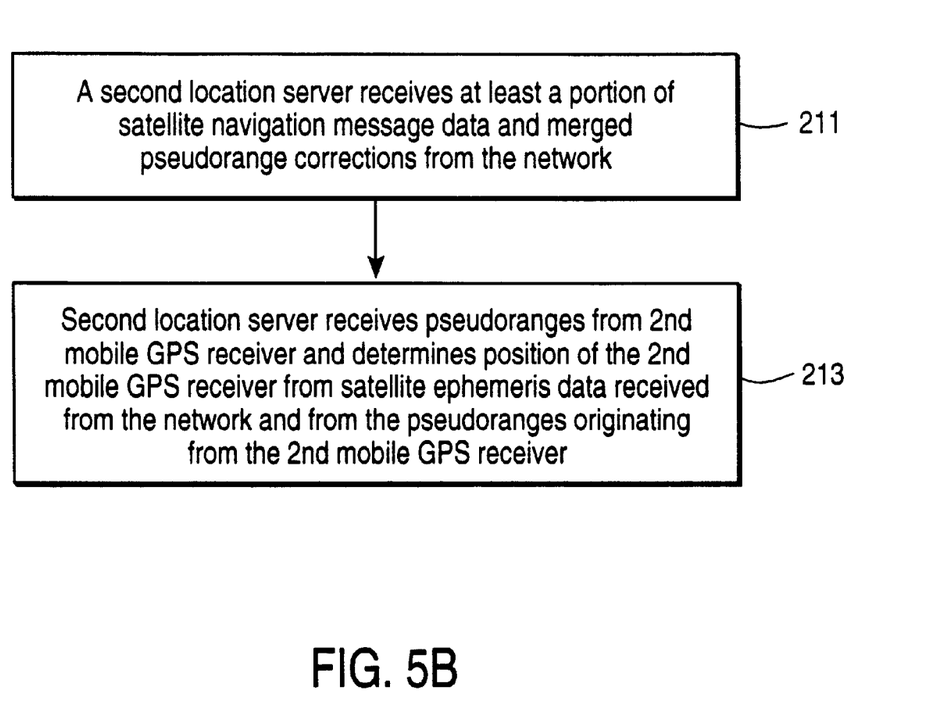

FIGS. 5A and 5B show in flowchart form a method of one embodiment of the present invention. In this method 200, each GPS reference receiver receives satellite ephemeris data from GPS satellites in view of the particular reference receiver and transmits the satellite ephemeris data (navigation message) into a communication network, such as a packetized data network 103 shown in FIG. 4. In a typical embodiment of this step 201, each GPS signal from a GPS satellite in view of the particular reference receiver is decoded to provide the binary 50 bit per second data stream which is present in the GPS signal, and this 50 bit per second data stream is transmitted into the communication network in real time or near real time. In an alternative embodiment, only portions of this data stream may be transmitted into the network as noted above. In step 203, each GPS reference receiver determines pseudorange corrections for pseudoranges to GPS satellites in view of the reference receiver; this operation may be performed in the conventional manner using a controller computer, such as the processor and network interface 95 shown in FIG. 3B. These pseudorange corrections from each GPS reference receiver are then transmitted into the communication network, such as the communication network 96 or network 103 of FIG. 4. In step 205, a processor, such as a network correction processor 110, which is coupled to the communication network, such as communication network 103, receives satellite ephemeris data and the pseudorange corrections. The network correction processor may produce a set of merged pseudorange corrections and perform other operations as described below. These merged pseudorange corrections are then transmitted into the communication network, such as communication network 103, in order that this information may be received by the various location servers which are also coupled to the communication network.

The method continues in step 207 in which a first location server receives at least a portion of the navigation message, such as satellite ephemeris data, and the merged pseudorange corrections from the network. Thus, for example, location server 115 may receive navigation message data which has been transmitted into the network by various GPS reference stations. This data is typically provided in a near real time manner, and typically each location server will receive at least satellite ephemeris data from two reference stations and often many more. Typically, the received satellite navigation message data is decoded by the location server to provide satellite clock and ephemeris data and is stored on the server, allowing the location server to calculate satellite positions and clock states on demand. This ephemeris data is used to calculate the position of a mobile GPS receiver after that receiver provides pseudoranges to satellites in view of the mobile GPS receiver. Thus, in step 209, the first location server receives pseudoranges from a first mobile GPS receiver and determines a position of the first mobile GPS receiver from satellite ephemeris data received from the network and from pseudoranges originating from the first mobile GPS receiver. The use of the network of reference stations allows the location server to calculate positions of mobile GPS receivers over a dispersed area which corresponds to the area of coverage of a GPS reference receiver network. Thus, rather than having a single GPS receiver located at the location server and providing ephemeris data to a location server, the dispersed network of GPS reference stations as shown in FIG. 4 allows the location server to provide position calculations for widely dispersed mobile GPS receivers. As shown in FIG. 4, a second location server may also be coupled to the communication network 103 in order to provide position solution calculations for mobile GPS receivers. It will be appreciated that in one embodiment the location server 117 may be a redundant/backup server for the location server 115 in case the location server 115 fails. Typically, each location server will be a fault-tolerant computer system. In situations where high data processing demands may be placed on a particular location server due to the dense population in a region covered by the location server, several location servers may be deployed in this region in addition to redundant location servers. Step 211 and 213 illustrate the use of the second location server in a method of the present invention. In step 211, a second location server receives satellite ephemeris data and corrected pseudorange corrections from the communication network. It will be appreciated that the satellite ephemeris data received from the network may be satellite-specific for those satellites which are in view of the reference stations in the corresponding area served by the location server 117. This may be performed by placing header packets or other addressing data with the satellite ephemeris data transmitted from a reference station and the corrected pseudorange corrections in order to address the data to a particular location server. In step 213, the second location server receives pseudoranges from a second mobile GPS receiver and determines the state (e.g. position) of the second mobile GPS receiver from the satellite navigation message data received from the network and from the pseudoranges originating from the second mobile GPS receiver.

FIG. 6 illustrates an example of the data flow in connection with a network correction processor, such as the processor 110 of FIG. 4. Each network correction processor merges corrections from multiple reference stations into a single set of corrections (and adjustments) having substantially the same applicable time for use by a location server. In one embodiment, one particular location server may, if it fails to receive correction data from a particular network correction processor, request the same information from a backup network correction processor in a geographically diverse location. Upon arrival at a network correction processor, each correction set is buffered in memory for lookup and use as necessary. Atmospheric errors are removed, and the corrections are merged to form a best estimate of ranging error due to satellite clock and position errors (including SA dither). These merged network corrections are then transmitted, along with key ionospheric data and the most up-to-date navigation message for appropriate satellites in view. In one particular embodiment, this information is transmitted to all designated location servers (which has been designated as the addressees of the corrections from the network correction processor). Because each satellite vehicle is tracked by more than one reference receiver in one embodiment, each set of network corrections can be checked to ensure internal consistency. Thus, a pseudorange correction from a first reference station may be compared against a pseudorange correction to the same satellite from an adjacent reference station to ensure internal consistency. As shown in FIG. 6, the reference stations 301 represent the geographically dispersed reference stations such as the stations 104–108 shown in FIG. 4. The pseudorange correction data 303 and the navigation message data which includes, in one embodiment, at least a portion of the 50 bit data stream contained within the GPS signals is transmitted to a network correction processor. The network correction processor extracts iono parameters 310 and creates a correction set for a single epoch 309. Atmospheric delays are removed and merged corrections are created 316. The data flow of the various operations described herein is further shown in FIG. 6.

Figure 7:
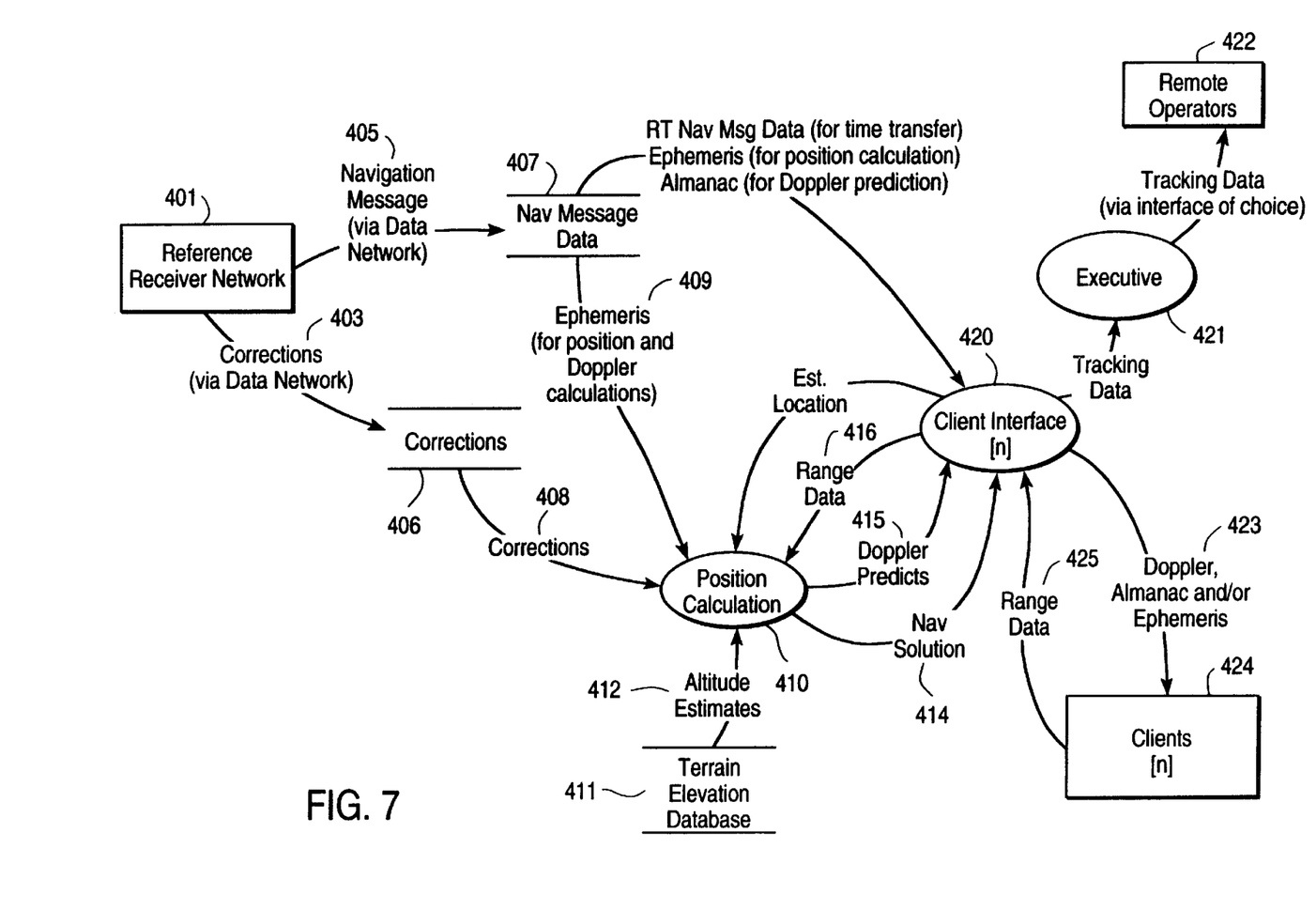
FIG. 7 shows an example of the data flow associated with the location server according to one embodiment of the present invention.

FIG. 7 illustrates an example of the flow of data in connection with a location server. FIG. 7 illustrates at least three different components of the system which are typically remotely located relative to the location server. The reference receiver network 401 corresponds to the reference stations 104–108 of FIG. 4. These reference stations are coupled to the location server through a communication network, such as the network 103 of FIG. 4. The reference receiver network 401 provides corrections and/or pseudorange data via the data network 403 and provides at least a portion of the navigation message 405 also via the data network. This navigation message typically includes the so-called satellite ephemeris data which is in one embodiment the 50 baud data stream in the GPS signals from each GPS satellite. The corrections 406 are merged, and checked for internal consistency in a correction processor and passed to the location server as corrections 408 and, optionally, geographic corrections, through the communication network. The navigation message data 407 is used to extract the ephemeris data for state (e.g. position) calculations for mobile GPS receivers. The state (e.g. position) calculation 410 may be aided by altitude estimates 412 from a terrain elevation database 411. The location server typically receives on a continuous basis both the correction data and the navigation message data via the communication network, such as the network 103. It will be appreciated therefore that the source of the satellite ephemeris data is not from a local GPS receiver which is co-located with the location server, but rather from a network of GPS reference receivers, such as the reference stations 104–108 of FIG. 4. In this manner, the location server may serve a large geographical area which would not be possible with a reference GPS receiver co-located with the location server.

While the location server continues to receive at least a portion of the satellite navigation message data and correction data from the GPS reference receiver network, it may receive requests for the position of a mobile GPS receiver, which is shown as clients 424. A typical transaction with a mobile GPS receiver begins with the exchange of data. Typically, Doppler data 423 is provided to a mobile GPS receiver 424 (based upon approximate position data from the mobile receiver or a cellular network element) and then pseudorange data 425 is provided by a mobile GPS receiver to a client interface 420 on the location server. This location transaction may, as pointed out above, be initiated at the mobile GPS receiver by pressing 911 in the case of a cellular telephone, or it may be initiated by a remote operator 422 which may be considered to correspond to the query terminal 29 of FIG. 1. As shown in FIG. 7, the Doppler prediction 414 is provided from the location server through the client interface 420 to the mobile GPS receiver 424, and the mobile GPS receiver typically responds with pseudorange data 425 which is used in conjunction with the ephemeris data 409 to determine the position of the mobile GPS receiver. The position calculation may be performed with any of various conventional position calculation algorithms found in typical GPS receivers. This position, shown as navigation solution 414, may then be provided to client interface 420 which then may transfer this information through an executive module 421, which is typically a software module, to a remote operator 422. In one embodiment, the remote operator 422 is a PSAP (Public Safety Answering Point) which is the control center which answers 911 telephone calls.

The client interface 420 manages the communication link between the location server and the client, such as a mobile GPS receiver. In one embodiment, one client interface object is allocated to each mobile GPS receiver by the executive interface. The client interface may typically be implemented by software operating on the location server. The executive module 421, which is also typically software operating on the location server, assigns interfaces to address remote operation requests. It also controls the interface to external databases and performs network management and other external interactions as necessary. Typically, a particular location server will provide multiple remote operator interfaces. For example, standard frame relay, X.25, and TCP/IP network connectivity may be provided to meet remote operator requirements.

While the foregoing description has assumed a certain architecture (in which a mobile SPS receiver receives SPS signals from SPS satellites and determines pseudoranges to those satellites and then transmits the pseudoranges, with a time stamp, to a location server which determines the mobile receiver's position), it will be appreciated that other architectures may be employed with the present invention. For example, a mobile SPS receiver may determine its own position by receiving SPS signals and determining pseudoranges and by receiving and using satellite ephemeris data (e.g. from a location server which sends appropriate satellite ephemeris data based on the approximate location of the mobile SPS receiver determined from the cell site which is communicating with the mobile SPS receiver). In this example, the location server receives the satellite ephemeris data from the receivers of the reference network and upon a request for the location of the mobile receiver, transmits the appropriate satellite ephemeris data to the mobile receiver through the cell based communication system (e.g. a cellular telephone system). The satellite ephemeris data which is appropriate is typically determined from an approximate location of the mobile receiver; this approximate location may be determined from the location of the cell site which has established a cell based wireless communication link with the mobile receiver. The location server may determine this approximate location from an identifier provided by the cell site; various techniques for determining and using the approximate location are described in co-pending U.S. patent application Ser. No. 08/842,559, filed Apr. 15, 1997 by Norman F. Krasner, which application is hereby incorporated herein by reference. The approximate location will determine the satellites in view, and the location server may then transmit satellite ephemeris data for those satellites through a mobile switching center and the cell site to the mobile receiver. The location server may also transmit Doppler prediction data and/or satellite almanac and/or pseudorange corrections to the mobile SPS receiver in this example.

Although the methods and apparatus of the present invention have been described with reference to GPS satellites, it will be appreciated that the teachings are equally applicable to positioning systems which utilize pseudolites or a combination of satellites and pseudolites. Pseudolites are ground based transmitters which broadcast a PN code (similar to a GPS signal) modulated on an L-band carrier signal, generally synchronized with GPS time. Each transmitter may be assigned a unique PN code so as to permit identification by a remote receiver. Pseudolites are useful in situations where GPS signals from an orbiting satellite might be unavailable, such as tunnels, mines, buildings or other enclosed areas. The term "satellite", as used herein, is intended to include pseudolite or equivalents of pseudolites, and the term GPS signals, as used herein, is intended to include GPS-like signals from pseudolites or equivalents of pseudolites.

In the preceding discussion the invention has been described with reference to application upon the United States Global Positioning Satellite (GPS) system. It should be evident, however, that these methods are equally applicable to similar satellite positioning systems, and in, particular, the Russian Glonass system The Glonass system primarily differs from GPS system in that the emissions from different satellites are differentiated from one another by utilizing slightly different carrier frequencies, rather than utilizing different pseudorandom codes. In this situation substantially all the circuitry and algorithms described previously are applicable with the exception that when processing a new satellite's emission a different exponential multiplier corresponding to the different carrier frequencies is used to preprocess the data. The term "GPS" used herein includes such alternative satellite positioning systems, including the Russian Glonass system.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A system for processing satellite position information, said system comprising:

a communication medium;

a first satellite positioning system (SPS) reference receiver having a first known position and having a first communication interface which is coupled to said communication medium, said first SPS reference receiver transmitting a first satellite ephemeris data into said communication medium;

a second SPS reference receiver having a second known position and having a second communication interface which is coupled to said communication medium, said second SPS reference receiver transmitting a second satellite ephemeris data into said communication medium; and a first digital processing system coupled to said communication medium to receive at least one of said first satellite ephemeris data and said second satellite ephemeris data and to provide satellite information for a mobile SPS receiver in order to determine a navigation solution of a position information for said mobile SPS receiver wherein said mobile SPS receiver is coupled to a wireless cellular receiver which receives said satellite information and provides said satellite information to said mobile SPS receiver and wherein said mobile SPS receiver determines a position solution from pseudoranges determined by said mobile SPS receiver.

2. A system as in claim 1 wherein said first satellite ephemeris data is received from a first set of SPS satellites in view of said first SPS reference receiver and wherein said second satellite ephemeris data is received from a second set of SPS satellites in view of said second SPS reference receiver.

3. A system as in claim 2 wherein said communication medium comprises a packet data network, and wherein said first communication interface and said second communication interface respectively provide said first satellite ephemeris data and said second satellite ephemeris data in packet data form.

4. A system as in claim 2 wherein said first SPS receiver transmits a first pseudorange data into said communication medium and said second SPS receiver transmits a second pseudorange data into said communication medium and wherein said first pseudorange data comprises at least one of first pseudoranges to satellites in view of said first SPS reference receiver and first corrections for pseudoranges to satellites in view of said first SPS reference receiver.

5. A system as in claim 4, said system further comprising:

a second digital processing system which is coupled to said communication medium, said first digital processing system receiving said first pseudorange data and receiving said second pseudorange data, and wherein said first digital processing system corrects said first pseudorange data to provide a first corrected pseudorange correction data which is transmitted into said communication medium and corrects said second pseudorange data to provide a second corrected pseudorange correction data which is transmitted into said communication medium.

* * * * *